(12) United States Patent
Kitada et al.

(10) Patent No.: US 8,991,984 B2
(45) Date of Patent: Mar. 31, 2015

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventors: Kazuya Kitada, Suwa (JP); Tsutomu Asakawa, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/847,712

(22) Filed: Mar. 20, 2013

(65) Prior Publication Data

US 2013/0257999 A1    Oct. 3, 2013

(30) Foreign Application Priority Data

Mar. 27, 2012   (JP) .................................. 2012-072573

(51) Int. Cl.
| | |
|---|---|
| B41J 2/045 | (2006.01) |
| B41J 2/14 | (2006.01) |
| H01L 41/18 | (2006.01) |
| H01L 41/08 | (2006.01) |
| H01L 41/187 | (2006.01) |
| B41J 2/16 | (2006.01) |
| H01L 41/318 | (2013.01) |

(52) U.S. Cl.
CPC ........... B41J 2/14201 (2013.01); H01L 41/183 (2013.01); H01L 41/0805 (2013.01); H01L 41/1878 (2013.01); B41J 2/14233 (2013.01); B41J 2/161 (2013.01); B41J 2/1623 (2013.01); B41J 2/1628 (2013.01); B41J 2/1629 (2013.01); B41J 2/1642 (2013.01); B41J 2/1645 (2013.01); B41J 2/1646 (2013.01); H01L 41/318 (2013.01); B41J 2002/14241 (2013.01); B41J 2002/14419 (2013.01)
USPC .......................................................... 347/68

(58) Field of Classification Search
None
See application file for complete search history.

(56) References Cited

U.S. PATENT DOCUMENTS

2007/0241642 A1 * 10/2007 Miyazawa et al. ............ 310/358
2009/0230211 A1    9/2009 Kobayashi et al.

FOREIGN PATENT DOCUMENTS

| JP | 2009-242229 | 10/2009 |
|---|---|---|
| JP | 2009-252789 | 10/2009 |

* cited by examiner

*Primary Examiner* — Matthew Luu
*Assistant Examiner* — Erica Lin
(74) *Attorney, Agent, or Firm* — Harness, Dickey & Pierce, P.L.C.

(57) ABSTRACT

A liquid ejecting head that discharges a liquid through a nozzle aperture includes a piezoelectric element. The piezoelectric element includes a piezoelectric layer and a first and a second electrode provided for the piezoelectric layer. The piezoelectric layer is made of a complex oxide containing bismuth, iron, barium and titanium and having a perovskite structure. The iron content in the piezoelectric layer is higher at the interface with the second electrode than other portions in the thickness direction of the piezoelectric layer.

3 Claims, 10 Drawing Sheets

LIQUID EJECTING HEAD, LIQUID EJECTING APPARATUS, AND PIEZOELECTRIC ELEMENT

The entire disclosure of Japanese Patent Application No. 2012-072573, filed Mar. 27, 2012 is incorporated by reference herein.

BACKGROUND

1. Technical Field

The present invention relates to a liquid ejecting head and a liquid ejecting apparatus, each including piezoelectric element that changes the pressure in a pressure generating chamber communicating with a nozzle aperture and includes a piezoelectric layer and electrodes applying a voltage to the piezoelectric layer, and to the piezoelectric element.

2. Related Art

Some of the piezoelectric elements have a structure in which a piezoelectric layer made of a piezoelectric material capable of electromechanical conversion, such as a crystallized dielectric material, is disposed between two electrodes. A piezoelectric element of this type can be used as a deflection vibration mode actuator device in a liquid ejecting head. Ink jet recording heads are a typical type of liquid ejecting head. An ink jet recording head includes a vibration plate defining a part of a pressure generating chamber communicating with nozzle apertures through which ink droplets are discharged. In the ink jet recording head, a piezoelectric element deforms the vibration plate to apply a pressure to the ink in the pressure generating chamber, thereby discharging ink droplets through the nozzle apertures.

The piezoelectric material (piezoelectric ceramic) used for forming the piezoelectric layer of such a piezoelectric element is required to have high piezoelectric properties, and a typical example of the piezoelectric material is lead zirconate titanate (PZT). On the other hand, it is desirable to reduce lead from piezoelectric materials, from the viewpoint of environmental protection. For example, $BiFeO_3$-based piezoelectric materials, which contain Bi and Fe, are lead-free. Among these are piezoelectric materials containing mixed crystals of $Bi(Fe, Mn)O_3$ and $BaTiO_3$ disclosed in, for example, JP-A-2009-252789.

Piezoelectric materials containing Bi, Ba, Fe and Ti result in lower strain than PZT piezoelectric materials disadvantageously. This issue arises not only in ink jet recording heads that discharge ink droplets, but also in other liquid ejecting heads that discharge droplets other than ink.

SUMMARY

Accordingly, an advantage of some aspects of the invention is that it provides a liquid ejecting head and a liquid ejecting apparatus, each including a piezoelectric element that has a low environmental load and produces a large strain.

According to an aspect of the invention, a liquid ejecting head that discharges liquid through a nozzle aperture is provided. The liquid ejecting head includes a piezoelectric element including a piezoelectric layer and a first and a second electrode provided for the piezoelectric layer. The piezoelectric layer is made of a complex oxide containing bismuth, iron, barium and titanium and having a perovskite structure. The iron content in the piezoelectric layer is higher at the interface with the second electrode than other portions in the thickness direction of the piezoelectric layer.

In this embodiment, the piezoelectric layer is made of a complex oxide having a perovskite structure containing bismuth, iron, barium and titanium, and the iron content in the piezoelectric layer is higher at the interface with the second electrode than other portions in the thickness direction. Consequently, the piezoelectric element of the embodiment produces a larger strain than piezoelectric elements in which the iron content in the piezoelectric layer at the interface with the second electrode is not increased, and accordingly exhibits larger displacement.

According to another aspect of the invention, a liquid ejecting apparatus including the above-described liquid ejecting head is provided. The liquid ejecting apparatus includes a liquid ejecting head that exhibits large displacement.

According to still another aspect of the invention, a piezoelectric element is provided which includes a piezoelectric layer, and a first and a second electrode provided for the piezoelectric layer. The piezoelectric layer is made of a complex oxide containing bismuth, iron, barium and titanium and having a perovskite structure. The iron content in the piezoelectric layer is higher at the interface with the second electrode than other portions in the thickness direction of the piezoelectric layer. In this embodiment, the piezoelectric layer is made of a complex oxide having a perovskite structure containing bismuth, iron, barium and titanium, and the iron content in the piezoelectric layer is higher at the interface with the second electrode than other portions in the thickness direction. Consequently, the piezoelectric element of the embodiment produces a larger strain than piezoelectric elements in the case where the iron content at the interface of the piezoelectric layer with the second electrode is not increased, and accordingly exhibits larger displacement.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
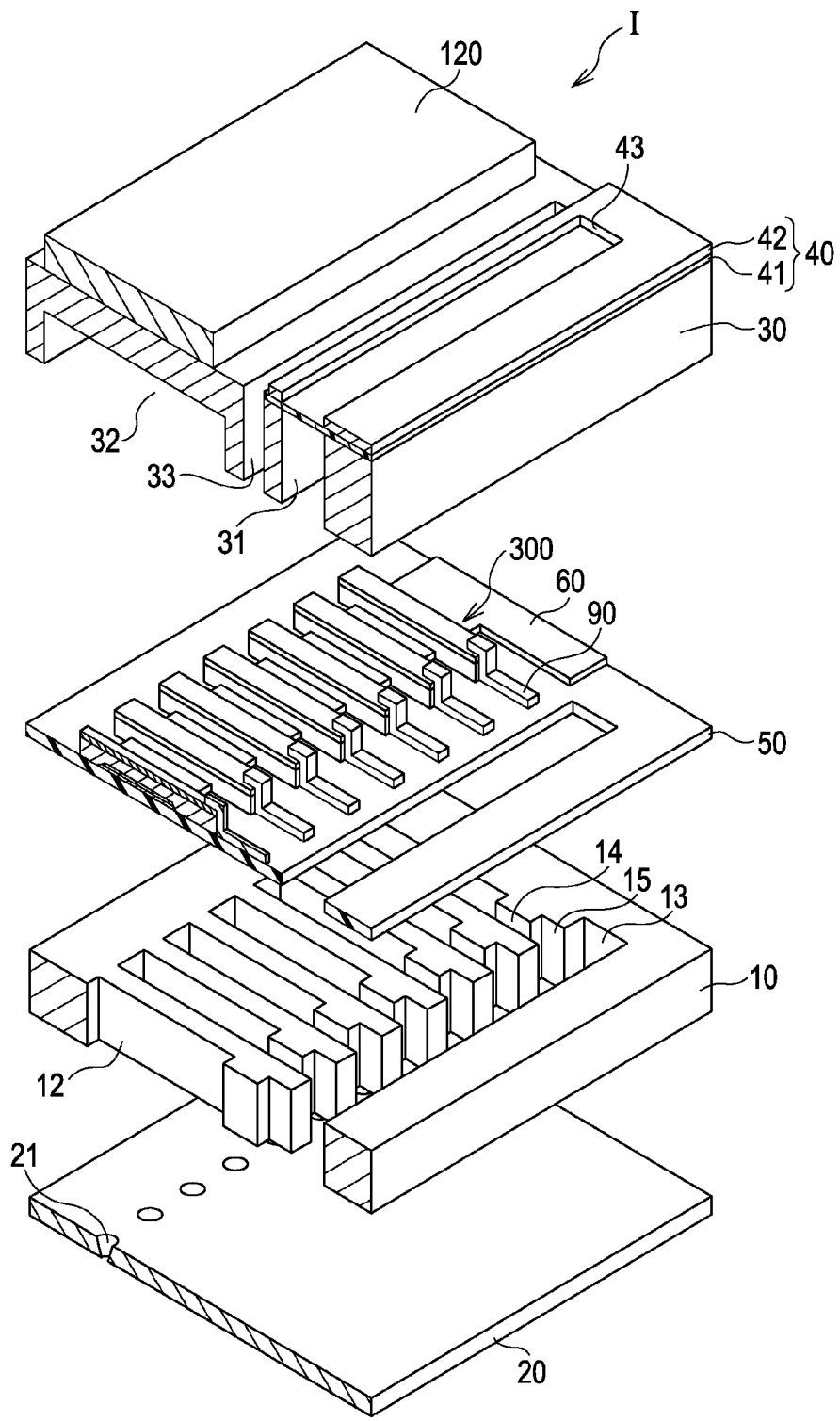
FIG. 1 is a schematic exploded perspective view of a recording head according to an embodiment of the invention.
Figure 2:
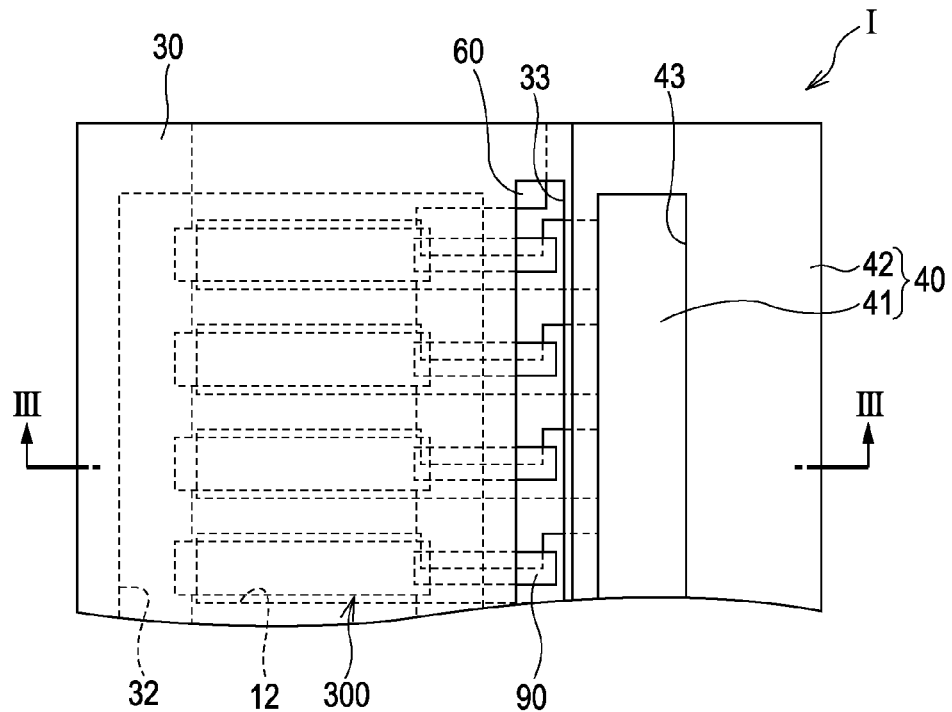
FIG. 2 is a plan view of the recording head according to the embodiment.
Figure 3:
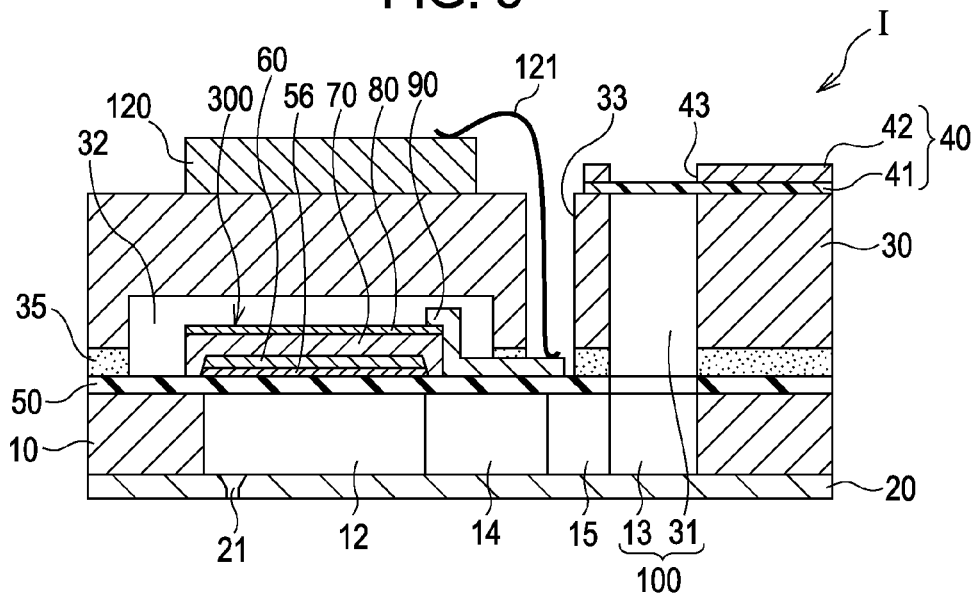
FIG. 3 is a sectional view of the recording head according to the embodiment.

FIG. 1 is a schematic exploded perspective view of an ink jet recording head, which is a type of liquid ejecting head, according to an embodiment of the invention. FIG. 2 is a plan view of the ink jet recording head shown in FIG. 1, and FIG. 3 is a sectional view taken along line III-III shown in FIG. 2. As shown in FIGS. 1 to 3, a flow channel substrate 10 of the present embodiment is defined by a monocrystalline silicon substrate, and a silicon dioxide elastic film 50 is disposed on one surface of the flow channel substrate 10.

The flow channel substrate 10 has a plurality of pressure generating chambers 12 arranged in parallel in the width direction of the pressure generating chambers 12. The flow channel substrate 10 also has a communicating section 13 therein located outside the pressure generating chambers 12 in the longitudinal direction of the pressure generating chambers 12. The communicating section 13 communicates with the pressure generating chambers 12 through corresponding ink supply channels 14 and communication paths 15. The communicating section 13 communicates with a reservoir section 31 formed in a protective substrate (described later) to define part of a reservoir acting as a common ink chamber of the pressure generating chambers 12. Each ink supply channel 14 has a smaller width than the pressure generating chamber 12, so that the flow channel resistance of the ink delivered to the pressure generating chamber 12 from the communicating section 13 is kept constant. Although the ink supply channels 14 are formed by narrowing the flow channels from one side in the present embodiment, the flow channels may be narrowed from both sides in another embodiment. Alternatively, the ink supply channels 14 may be formed by reducing the depth of the flow channels, instead of narrowing the flow channels. In the present embodiment, the flow channel substrate 10 has liquid flow channels including the pressure generating chambers 12, the communicating section 13, the ink supply channels 14 and the communication paths 15.

The flow channel substrate 10 is joined to a nozzle plate 20 at the open side thereof with an adhesive, a thermal fusion film or the like. The nozzle plate 20 has nozzle apertures 21 communicating with portions around the ends of the corresponding pressure generating chambers 12 opposite to the ink supply channels 14. The nozzle plate 20 can be made of, for example, glass-ceramic, monocrystalline silicon or stainless steel.

On the opposite side to the open side of the flow channel substrate 10, the above-mentioned elastic film 50 is disposed, and an adhesion layer 56 having a thickness of, for example, about 30 to 50 nm and made of titanium oxide or the like is disposed on the elastic film 50 to enhance the adhesion between the elastic film 50 and the overlying first electrode 60. The elastic film 50 may be provided thereon with an insulating film made of zirconium oxide or the like, if necessary.

Furthermore, piezoelectric elements 300 are disposed on the adhesion layer 56. Each piezoelectric element 300 has a multilayer structure including the first electrode 60 made of platinum, a piezoelectric layer 70 having a small thickness of 2 μm or less, preferably 0.3 to 1.5 μm, and a second electrode 80. The piezoelectric element 300 mentioned herein refers to the portion including the first electrode 60, the piezoelectric layer 70 and the second electrode 80. In general, one of the electrodes of the piezoelectric element 300 acts as a common electrode, and the other electrode and the piezoelectric layer 70 are formed for each pressure generating chamber 12 by patterning. Although in the present embodiment, the first electrode 60 acts as the common electrode of the piezoelectric elements 300 and the second electrode 80 is provided as discrete electrodes of the piezoelectric elements 300, the functions of the first and second electrodes may be reversed for the sake of convenience of arrangement of the drive circuit and wiring. An actuator device mentioned herein is defined as a combination of the piezoelectric element 300 and a vibration plate that is displaced by the operation of the piezoelectric element 300. Although in the present embodiment, the elastic film 50, the adhesion layer 56 and the first electrode 60, and optionally an insulating film, act as a vibration plate, the vibration plate is not limited to this structure, and the elastic film 50 and the adhesion layer 56 are not necessarily provided. The piezoelectric element 300 may double as a vibration plate.

In the present embodiment, the piezoelectric material forming the piezoelectric layer 70 is a complex oxide containing bismuth (Bi), iron (Fe), barium (Ba) and titanium (Ti) and having a perovskite structure. The A site of the perovskite structure, that is, ABO$_3$ structure, has 12 oxygen ligands, and the B site has 6 oxygen ligands to form an octahedron. Bi and Ba are present in the A site, and Fe and Ti are present in the B site.

The complex oxide containing Bi, Fe, Ba and Ti and having a perovskite structure can be represented by a complex oxide having a perovskite structure of a mixed crystal of bismuth ferrate and barium titanate, or a solid solution in which bismuth ferrate and barium titanate are uniformly dissolved. Bismuth ferrate and barium titanate cannot be detected independently in an X-ray diffraction pattern.

Bismuth ferrate and barium titanate are each a known piezoelectric material having a perovskite structure, and their various compositions are known. In addition to BiFeO$_3$ or BaTiO$_3$, for example, a form in which an element (Bi, Fe, Ba or Ti) is provided in a short or an excessive amount, or a form in which some atoms of the elements are substituted with another element is known as bismuth ferrate or barium titanate. Bismuth ferrate and barium titanate mentioned herein include compositions deviated from their stoichiometric composition by partial loss or excess of one or more elements and compositions in which some atoms of the elements are substituted with another element. In the composition, the proportion of bismuth ferrate and barium titanate may be varied.

The composition of the piezoelectric layer 70 made of a complex oxide having such a perovskite structure is represented as a mixed crystal expressed by general formula (1) shown below. Also, general formula (1) may be expressed by general formula (1') shown below. General formula (1) and general formula (1') express a composition based on the stoichiometry. As long as it has a perovskite structure, the composition may be inevitably varied by lattice mismatch, oxygen defects and so forth, or same atoms of the elements may be substituted, as described above. For example, when the stoichiometric ratio is 1, an allowable range is in the range of 0.85 to 1.20. When the mole fractions of the A site elements and B site elements are the same in two compositions expressed by either of the following general formulas, the two compositions may be considered to be the same complex oxide.

(1-x)[BiFeO$_3$]-x[BaTiO$_3$]     (1)

(0<x<0.40)

(Bi$_{1-x}$Ba$_x$)(Fe$_{1-x}$Ti$_x$)O$_3$     (1')

(0<x<0.40)

The complex oxide of the piezoelectric layer 70 may contain other elements in addition to Bi, Fe, Ba and Ti. Such elements include, for example, Mn, Co and Cr. Even if the complex oxide contains these elements, the complex oxide has a perovskite structure.

When the piezoelectric layer 70 contains Mn, Co or Cr, the complex oxide has a structure in which Mn, Co or Cr is present in the B side of the perovskite structure. For example, when Mn is contained, the complex oxide of the piezoelectric layer 70 has a structure in which some of the Fe atoms in the solid solution containing uniformly dissolved bismuth ferrate and barium titanate are substituted with Mn atoms, or has a perovskite structure of a mixed crystal of bismuth ferrate manganate and barium titanate, and its fundamental characteristics are the same as the complex oxide having a perovskite structure of a mixed crystal of bismuth ferrate and barium titanate while properties involved in leakage current are improved. When Co or Cr is contained, properties involved in leakage current are also improved as in the case of Mn. Bismuth ferrate, barium titanate, bismuth ferrate manganate, bismuth ferrate cobaltate and bismuth ferrate chromate cannot be detected independently in an X-ray diffraction pattern. Although cases where Mn, Co or Cr is contained are described above by way of example, properties involved in leakage current are also improved in the case where two elements of other transition metal elements are simultaneously contained. Such a complex oxide can be used for the piezoelectric layer 70, and other known additives may be added in order to improve the characteristics.

The piezoelectric layer 70 made of such a complex oxide containing Mn, Co, or Cr in addition to Bi, Fe, Ba and Ti and having a perovskite structure is a mixed crystal expressed by, for example, general formula (2) shown below. Also, general formula (2) may be expressed by general formula (2') shown below. In general formula (2) and general formula (2'), M represents Mn, Co, or Cr. General formula (2) and general formula (2') express a composition based on the stoichiometry. As long as it has a perovskite structure, the composition may be inevitably varied by lattice mismatch, oxygen defects and so forth, as described above. For example, when the stoichiometric ratio is 1, an allowable range is in the range of 0.85 to 1.20. When the mole fractions of the A site elements and B site elements are the same in two compositions expressed by either of the following general formulas, the two compositions may be considered to be the same complex oxide.

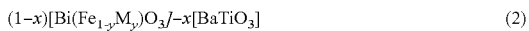

$(1-x)[Bi(Fe_{1-y}M_y)O_3]-x[BaTiO_3]$ (2)

$(0 < x < 0.40, 0.01 < y < 0.10)$

$(Bi_{1-x}Ba_x)((Fe_{1-y}M_y)_{1-x}Ti_x)O_3$ (2')

$(0 < x < 0.40, 0.01 < y < 0.10)$

The iron content in the piezoelectric layer 70 is higher at the interface of the piezoelectric layer 70 with the second electrode 80, or in the interface portion of the piezoelectric layer 70 close to the second electrode in the thickness direction, than other portions in the thickness direction. The interface portion of the piezoelectric layer 70 close to the second electrode 80 refers to the interface of the piezoelectric layer 70 with the second electrode 80, and a portion from the surface of the piezoelectric layer 70 to the depth of, for example, 10 nm or less. Whether the iron content is increased at the interface can be examined by, for example, secondary ion mass spectrometry (SIMS).

The second electrode 80 provided for each piezoelectric element 300 is connected to a lead electrode 90 made of, for example, gold (Au). The lead electrode 90 extends from the end of the second electrode 80 near the ink supply channel 14 to the upper surface of the elastic film and, optionally, to the upper surface of an insulating film.

A protective substrate 30 having a reservoir section 31 defining at least part of a reservoir 100 is joined to the flow channel substrate 10 having the piezoelectric elements 300 with an adhesive 35 so as to cover the first electrode 60, the elastic film 50, an optionally provided insulating film, and the lead electrodes 90. The reservoir section 31 passes through the protective substrate 30 in the thickness direction and extends along the widths of the pressure generating chambers 12. Thus, the reservoir section 31 communicates with the communicating section 13 of the flow channel substrate 10 to form the reservoir 100 acting as the common ink chamber of the pressure generating chambers 12. The communicating section 13 of the flow channel substrate 10 may be divided for each pressure generating chamber 12, and only the reservoir section 31 may serve as the reservoir. Alternatively, the flow channel substrate 10 may have only the pressure generating chambers 12, and the ink supply channels 14 communicating between the reservoir 100 and the respective pressure generating chambers 12 are formed in a member between the flow channel substrate 10 and the protective substrate 30, such as the elastic film 50 and an optionally provided insulating film.

A piezoelectric element-protecting section 32 is disposed in the region of the protective substrate 30 opposing the piezoelectric elements 300. The Piezoelectric element-protecting section 32 has a space so that the piezoelectric elements 300 can operate without interference. The space of the piezoelectric element-protecting section 32 is intended to ensure the operation of the piezoelectric elements 300, and may or may not be sealed.

Preferably, the protective substrate 30 is made of a material having substantially the same thermal expansion coefficient as the flow channel substrate 10, such as glass or ceramic. In the present embodiment, the protective substrate 30 is made of the same monocrystalline silicon as the flow channel substrate 10.

The protective substrate 30 has a through hole 33 passing through the protective substrate 30 in the thickness direction. The ends of the lead electrodes 90 extending from the piezoelectric elements 300 are exposed in the through hole 33.

A drive circuit 120 is secured on the protective substrate 30 and drives the piezoelectric elements 300 arranged in parallel. The drive circuit 120 may be a circuit board, a semiconductor integrated circuit (IC) or the like. The drive circuit 120 is electrically connected to each lead electrode 90 with a conductive connection wire 121, such as bonding wire.

Furthermore, a compliance substrate 40 including a sealing film 41 and a fixing plate 42 is joined on the protective substrate 30. The sealing film 41 is made of a flexible material having a low rigidity, and seals one end of the reservoir section 31. The fixing plate 42 is made of a relatively hard material. The portion of the fixing plate 42 opposing the reservoir 100 is completely removed to form an opening 43; hence the reservoir 100 is closed at one end only with the flexible sealing film 41.

The ink jet recording head I of the present embodiment draws an ink through an ink inlet connected to an external ink supply unit (not shown). The ink is delivered to fill the spaces from the reservoir 100 to the nozzle apertures 21. Then, the ink jet recording head I applies a voltage between the first electrode 60 and each second electrode 50 corresponding to the pressure generating chambers 12, according to the recording signal from the drive circuit 120. Thus, the elastic film 50, the adhesion layer 56, the first electrode 60 and the piezoelectric layers 70 are deformed to increase the internal pressure in the pressure generating chambers 12, thereby ejecting the ink through the nozzle apertures 21. Since the present embodiment ensures high adhesion between the first electrode 60 and the piezoelectric layer 70, the first electrode 60 is prevented from separating from the piezoelectric layer 70 even if the piezoelectric element is repeatedly operated. Thus, the ink jet recording head or liquid ejecting head can exhibit high durability and reliability.

A method for manufacturing the ink jet recording head according to the present embodiment will be described with reference to FIGS. 4A to 8B. FIGS. 4A to 8B are sectional views of the pressure generating chamber taken in the longitudinal direction.

Figure 4A:
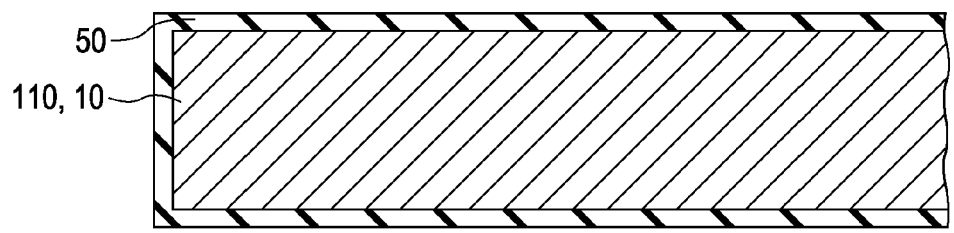
FIGS. 4A and 4B are sectional views showing a manufacturing process of the recording head according to the embodiment.
Figure 4B:
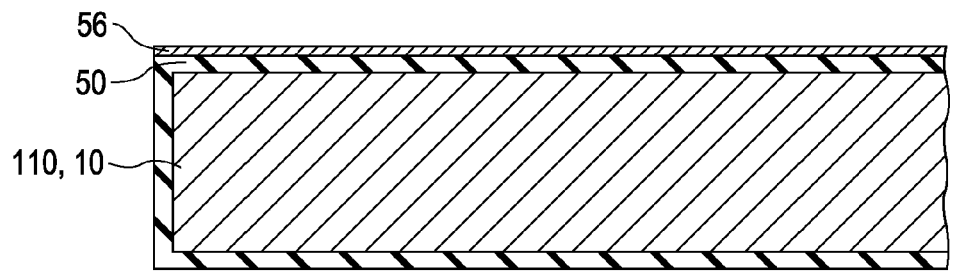

As shown in FIG. 4A, a silicon dioxide film that will form an elastic film 50 is formed of silicon dioxide ($SiO_2$) or the like, by thermal oxidation or the like, on the surface of a silicon flow channel substrate wafer 110. Then, an adhesion layer 56 is formed of, for example, titanium oxide on the $SiO_2$ elastic film 50 by sputtering, thermal oxidation or the like, as shown in FIG. 4B.

Figure 5A:
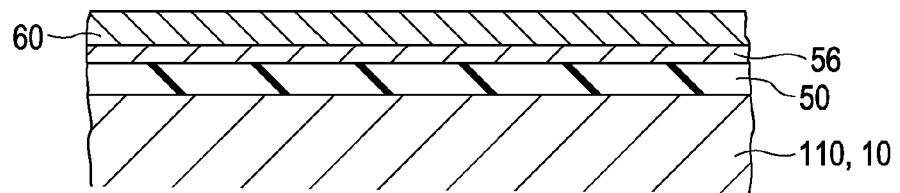
FIGS. 5A to 5C are sectional views showing the manufacturing process according to the embodiment.

Subsequently, as shown in FIG. 5A, a platinum first electrode 60 is formed over the entire surface of the adhesion layer 56 by sputtering.

Then, a piezoelectric layer 70 is formed on the first electrode 60. The piezoelectric layer 70 may be formed by any method without particular limitation. For example, a chemical solution method may be applied, such as a sol-gel method or a metal-organic decomposition (MOD) method in which a solution of organic metal compounds containing Bi, Fe, Mn, Ti and Ba dissolved or dispersed in a solvent is applied onto the first electrode 60, and the coating of the solution is dried and then fired to form a metal oxide piezoelectric layer 70. Other methods may be used, such as laser ablation, sputtering, pulsed laser deposition (PLD), CVD or aerosol deposition, irrespective of liquid process or solid process.

Figure 5B:
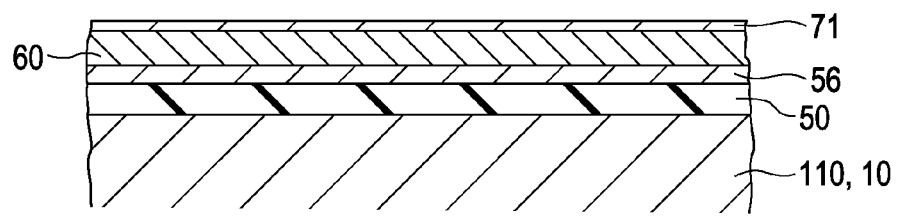

More specifically, as shown in FIG. 5B, a sol or MOD solution (precursor solution) containing organic metal compounds containing Bi, Fe, Mn, Ti and Ba in such proportions as the resulting layer can have a desired composition is applied onto the first electrode 60 by spin coating or the like to form a piezoelectric precursor film 71 (coating step).

The precursor solution is prepared by mixing organic metal compounds containing Bi, Fe, Mn, Ti and Ba so that the metals have desired mole fractions, and dissolving or dispersing the mixture in an organic solvent such as an alcohol. In the present embodiment, the mole ratios of the metals in the precursor solution satisfy the following relationships $0.01 \leq Ba/Bi \leq 0.6$ and $0.01 \leq Mn/Bi \leq 0.1$. Organic metal compounds containing Bi, Fe, Mn, Ti or Ba include metal alkoxides, organic acid salts, and β-diketone complexes. For example, the organic metal compound containing Bi may be bismuth 2-ethylhexanoate. For example, the organic metal compound containing Fe may be iron 2-ethylhexanoate. For example, the organic metal compound containing Mn may be manganese 2-ethylhexanoate. Examples of the organic metal compound containing Ti include titanium isopropoxide, titanium 2-ethylhexanoate, and titanium diisopropoxide bis(acetylacetonate). Examples of the organic metal compound containing Ba include barium isopropoxide, barium 2-ethylhexanoate, and barium acetylacetonate. Organic metal compounds containing two or more of Bi, Fe, Mn, Ti and Ba may of course be used.

Subsequently, the piezoelectric precursor film 71 is dried for a certain time by being heated to a predetermined temperature (for example, 150 to 200° C.) (drying step). Then, the dried piezoelectric precursor film 71 is degreased by being heated to a predetermined temperature (for example, 350 to 450° C.) and allowed to stand at that temperature for a certain time (degreasing step). The degreasing mentioned herein is performed to remove the organic components from the piezoelectric precursor film 71, for example, as $NO_2$, $CO_2$ or $H_2O$. The drying and degreasing may be performed in any atmosphere without particular limitation, and may be performed in the air, an oxygen atmosphere or an inert gas atmosphere. The steps of coating, drying and degreasing may be repeated.

Figure 5C:
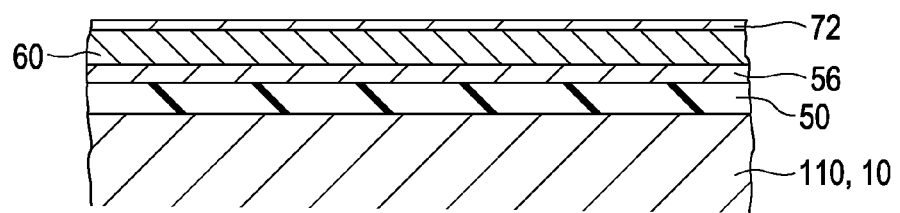

Then, the piezoelectric precursor film 71 is crystallized by being heated and allowed to stand for a certain time, thus forming a piezoelectric film 72, as shown in FIG. 5C (firing step). The firing step can be performed at a heating temperature of, for example, about 600 to 800° C.

It is understood that the iron content in the piezoelectric layer 70 is increased in the surface at the interface with the second electrode 80 by the heat of the firing step (from FIG. 9), and consequently, the strain of the piezoelectric layer is increased. Accordingly, in order to increase the strain, the iron content at the interface of the piezoelectric layer 70 is increased by controlling the temperature or time of the firing step or the number of times of the firing step. It is also understood that, in this instance, the bismuth content is increased with the increase of the iron content in some cases (from FIG. 9).

Alternatively, in order to control the iron content in the piezoelectric layer 70 so as to be higher at the surface than other portions, a precursor solution having a higher iron content than the above-mentioned precursor solution may be applied to the uppermost layer of the piezoelectric layer 70, followed by drying, degreasing and firing. This increases the strain.

The heating apparatus used for the drying, degreasing and firing steps may be a rapid thermal annealing (RTA) apparatus using an infrared lamp for heating, or a hot plate.

Figure 6A:
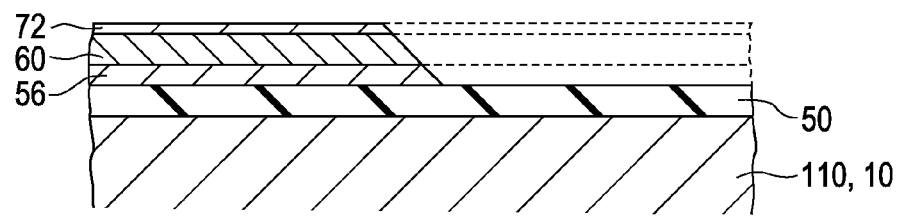
FIGS. 6A and 6B are sectional views showing the manufacturing process according to the embodiment.

Then, a resist layer (not shown) having a predetermined shape is formed on the piezoelectric film 72, and the piezoelectric film 72 and the first electrode 60 are simultaneously patterned in such a manner that their sides are inclined, as shown in FIG. 6A, using the resist layer as a mask.

Figure 6B:
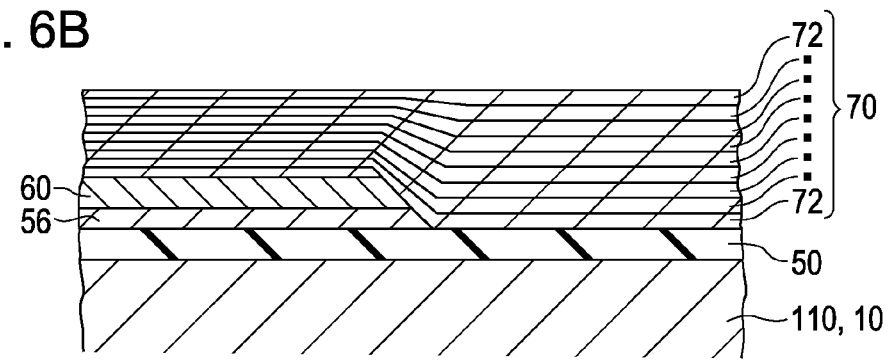

The steps of coating, drying and degreasing, or the steps of coating, drying, degreasing and firing may be repeated according to the desired thickness, so that the piezoelectric layer 70 including a plurality of piezoelectric films 72 is formed. Thus, the piezoelectric layer 70 including the piezoelectric films 72 is formed to a predetermined thickness, as shown in FIG. 6B. If, for example, a coating formed by a single application of the coating solution has a thickness of about 0.1 μm, the piezoelectric layer 70 including 10 piezoelectric films 72 has a total thickness of about 1.0 μm. For forming the piezoelectric films 72, the steps of coating, drying, degreasing and firing may be performed step by step, or the firing step may be performed at one time after the sequence of the steps of coating, drying and degreasing has been repeated.

Figure 7A:
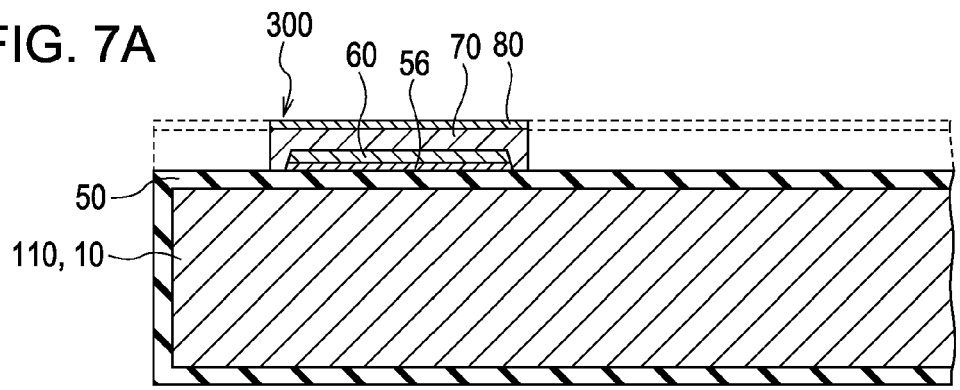
FIGS. 7A to 7C are sectional views showing the manufacturing process according to the embodiment.

After the piezoelectric layer 70 is formed, a layer for second electrodes 80 is formed of platinum on the piezoelectric layer 70 by sputtering or the like, and the piezoelectric layer 70 and the layer for the second electrodes 80 are simultaneously patterned so as to form piezoelectric elements 300, each including the first electrode 60, the piezoelectric layer 70 and the second electrode 80, in regions corresponding to the pressure generating chambers 12, as shown in FIG. 7A. The patterning of the piezoelectric layer 70 and the second electrode 80 can be performed at one time by dry etching through a resist layer (not shown) having a predetermined shape. Then, annealing may be performed at a temperature of, for example, 600 to 800° C., if necessary. Thus, satisfactory interfaces can be formed between the piezoelectric layer 70 and the first electrode 60 and between the piezoelectric layer 70 and the second electrode 80, and, in addition, the crystallinity of the piezoelectric layer 70 can be improved.

Figure 7B:
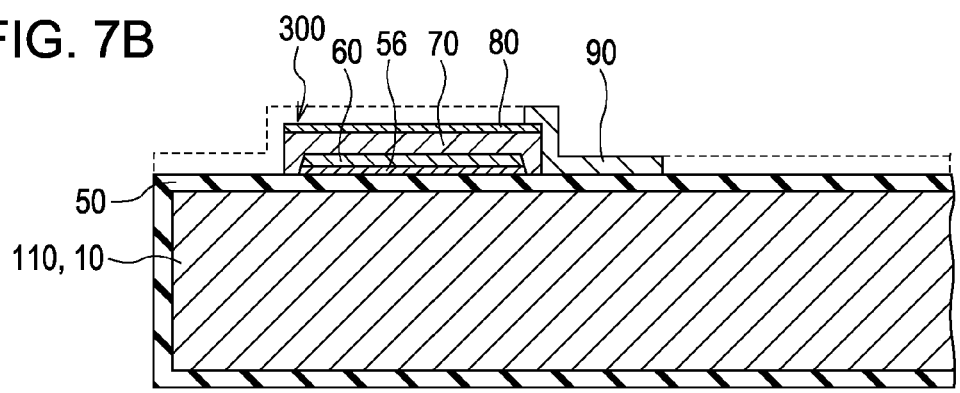

Then, a film is formed of, for example, gold (Au), over the entire surface of the flow channel substrate wafer 110, and is patterned into lead electrodes 90 for each piezoelectric element 300, as shown in FIG. 7B, through a mask pattern (not shown) made of, for example, resist.

Figure 7C:
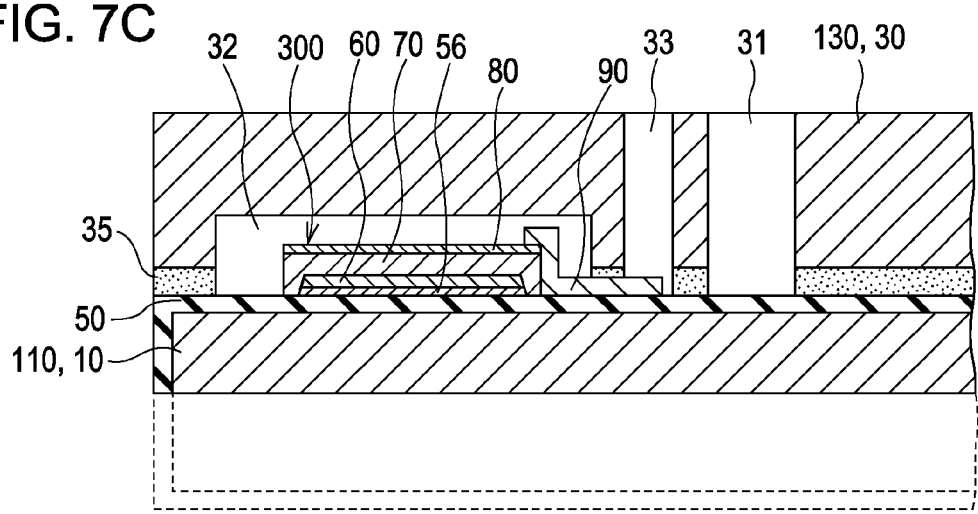

Then, a silicon protective substrate wafer 130 for a plurality of protective substrates 30 is bonded to the piezoelectric element 300 side of the flow channel substrate wafer 110 with an adhesive 35, and the thickness of the flow channel substrate wafer 110 is reduced to a predetermined level, as shown in FIG. 7C.

Figure 8A:
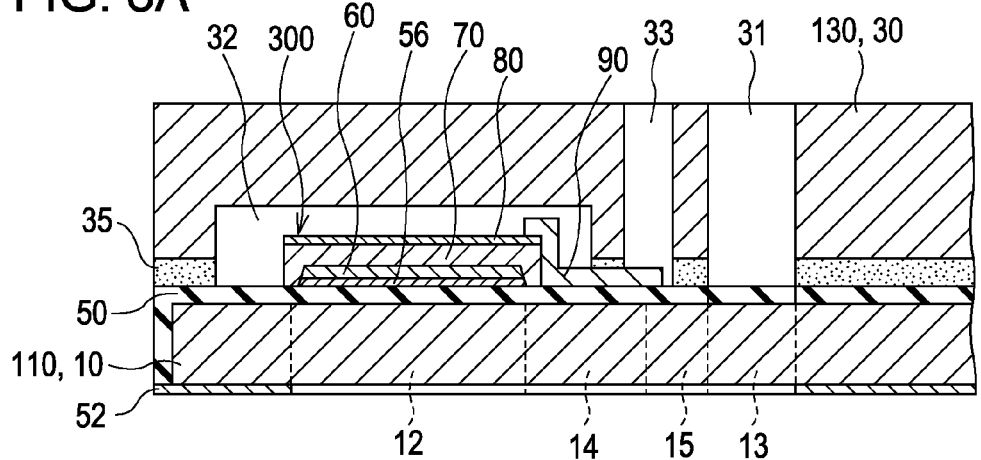
FIGS. 8A and 8B are sectional views showing the manufacturing process according to the embodiment.

Turning to FIG. 8A, a mask layer is formed on the surface of the flow channel substrate wafer 110 opposite to the protective substrate wafer 130 and is patterned into a mask 52 having a predetermined shape.

Figure 8B:
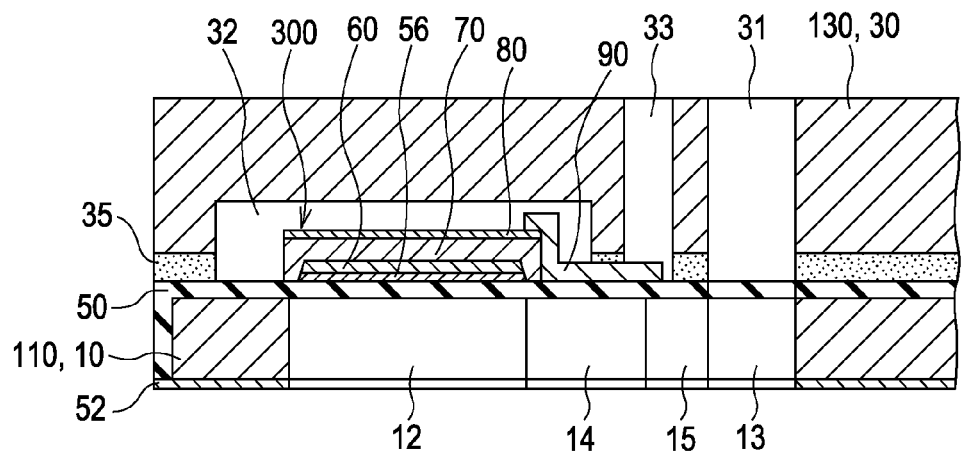

Subsequently, as shown in FIG. 8B, the flow channel substrate wafer 110 is subjected to anisotropic etching (wet etching) using an alkaline solution, such as KOH, through the mask 52 to form the pressure generating chambers 12 corresponding to the piezoelectric elements 300, the communicating section 13, the ink supply channels 14 and the communication paths 15 therein.

Then, unnecessary outer portions of the flow channel substrate wafer 110 and protective substrate wafer 130 are cut off by, for example, dicing. Subsequently, a nozzle plate 20 having nozzle apertures 21 therein is joined to the surface of the flow channel substrate wafer 110 opposite the protective substrate wafer 130 after the mask 52 has been removed, and a compliance substrate 40 is joined to the protective substrate wafer 130. The flow channel substrate wafer 110 joined to other substrates is cut into chips as shown in FIG. 1, each including a flow channel substrate 10 and other members. Thus, the ink jet recording head I of the present embodiment is completed.

EXAMPLES

The invention will be further described in detail with reference to Examples below. However, the invention is not limited to the following Examples.

Example 1

First, a silicon dioxide film was formed to a thickness of 1170 nm on a (110)-oriented monocrystalline silicon substrate by thermal oxidation. Subsequently, a titanium film was formed to a thickness of 40 nm on the silicon dioxide film by RF magnetron sputtering, and was then oxidized to form a titanium oxide film. Then, a platinum film was formed to a thickness of 100 nm on the titanium oxide film by RF magnetron sputtering, thus forming a (111)-oriented first electrode 60.

A precursor solution was prepared by mixing solutions of bismuth 2-ethylhexanoate, iron 2-ethylhexanoate, barium 2-ethylhexanoate, titanium 2-ethylhexanoate and manganese 2-ethylhexanoate, each in n-octane, in a mole ratio of Bi:Ba:Fe:Ti:Mn=75:25:71.25:25:3.75 (BFM:BT=75:25).

The precursor solution was dropped onto the surface of the substrate on which the titanium oxide film and the first electrode 60 had been formed, and was then subjected to spin coating at a speed of 3000 rpm, thus forming a piezoelectric precursor film (coating step). Then, the piezoelectric precursor film on the substrate was dried on a hot plate at 180° C. for 2 minutes (drying step). The piezoelectric precursor film was further subjected to degreasing on a hot plate at 350° C. for 2 minutes (degreasing step). The sequence of the steps of coating, drying and degreasing was repeated three times, and, then, the resulting precursor films were fired at 800° C. for 5 minutes in an oxygen atmosphere using a rapid thermal annealing (RTA) apparatus (firing step).

Subsequently, a sequence performing two sequences of the steps of coating, drying and degreasing and then performing the firing step was repeated four times. Thus, a piezoelectric layer 70 was formed to a thickness of 841 nm by 12 coating steps in total.

Then, a platinum film having a diameter of 500 µm and a thickness of 100 nm was formed as a second electrode 80 on the piezoelectric layer 70 by DC sputtering, and was then fired at 750° C. for 5 minutes by RTA to complete a piezoelectric element.

Example 2

A piezoelectric element was prepared in the same manner as in Example 1 except that the uppermost film of the piezoelectric layer was formed using a coating solution containing elements in proportions of Bi:Ba:Fe:Ti:Mn=75:25:78.375:25:3.75 and that the firing was performed at 800° C.

Comparative Example 1

A piezoelectric element was prepared in the same manner as in Example 1, except that the firing temperature was set at 650° C.

Examination 1

Figure 9:
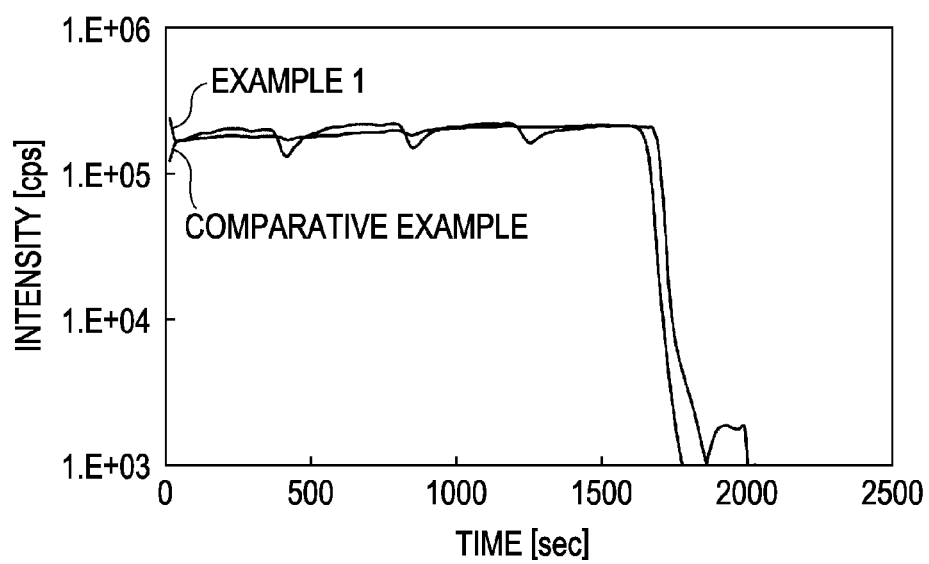
FIG. 9 is a plot showing Fe compositional profiles measured along the depth of piezoelectric elements by SIMS.
Figure 10:
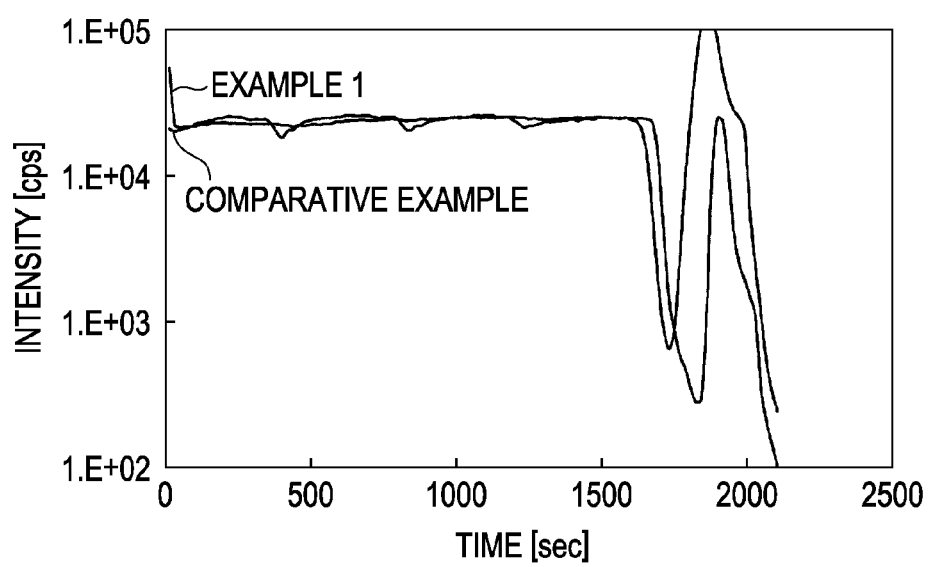
FIG. 10 is a plot showing Bi compositional profiles measured along the depth of piezoelectric elements by SIMS.

Before forming the second electrode, the piezoelectric elements of Example 1 and the Comparative Example were measured for compositional profiles along the depth with a secondary ion mass spectrometer (SIMS) IMS-7f manufactured by CAMECA. For the measurement, 20 nA $O_2^+$ accelerated to 3 keV was used as the primary ion beam. Raster scan was performed on the surface of the sample at a size of 100 µm by 100 µm with the primary ion beam, and positive secondary ions were detected from the center of the raster scan area 33 µm in diameter. In addition, in order to prevent charging up during the SIMS analysis, a gold conductive film was formed on the surface of the sample in advance, and electron beam irradiation was performed with an electron gun. Also, in order to separate interfering ions having a mass-to-charge ratio close to $^{209}Bi^+$, the measurement was performed in a high mass resolution mode. The results are shown in FIGS. 9 and 10. FIG. 9 shows the Fe compositional profiles along the depth of the piezoelectric layer, and FIG. 10 shows the Bi compositional profiles along the depth of the piezoelectric layer.

As shown in the these results, in Example 1, the Fe and Bi contents in the portion from the surface to the depth of about 50 nm (depth corresponding to 30 to 50 seconds) were increased at the surface (interface with the second electrode). On the other hand, in the Comparative Example, the Fe content in the same portion was reduced at the surface (interface with the second electrode), and the Bi content in the same portion was hardly varied.

Examination 2

Figure 11:
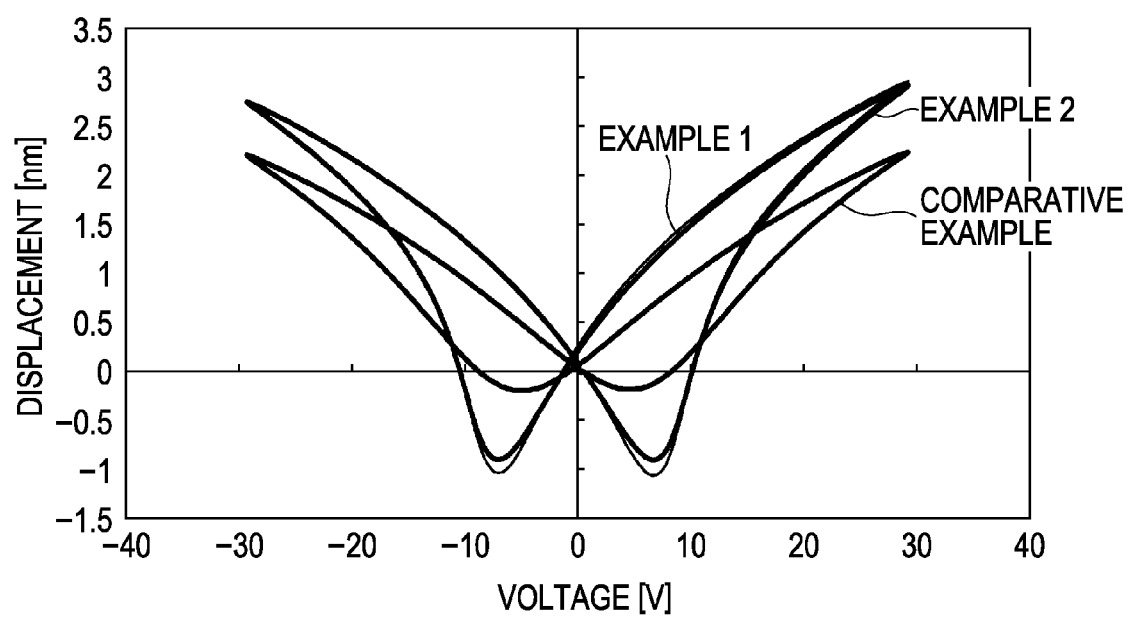
FIG. 11 is a plot of S-V curves of the piezoelectric elements of Examples 1 and 2 and Comparative Example 1.

The relationships between the electric field-induced strain (displacement) and the voltage (S-V curve) of the piezoelectric element of Examples 1 and 2 and the Comparative Example were obtained at room temperature with a double-beam laser interferometer (DBLI) manufactured by aix-ACCT by applying a voltage of 1 kHz in frequency using an electrode pattern having a diameter of 500 µm. The results are shown in FIG. 11.

The results show that the piezoelectric elements of Examples 1 and 2 exhibited larger strains than that of the Comparative Example.

Other Embodiments

Although an exemplary embodiment of the invention has been described, the invention is not limited to the disclosed embodiment. For example, in the above embodiment, a monocrystalline silicon substrate is used as the flow channel substrate 10. However, the flow channel substrate 10 may be made of, for example, silicon-on-insulator (SOI) or glass, without particular limitation.

Also, although the piezoelectric element 300 of the above embodiment includes the first electrode 60, the piezoelectric layer 70 and the second electrode 80 that are formed in that order on a substrate (flow channel substrate 10), the structure of the piezoelectric element is not limited to this structure. For example, an embodiment of the invention can be applied to a vertical vibration piezoelectric element including layers of a piezoelectric material and an electrode material alternately formed so as to expand and contract in an axis direction.

Figure 12:
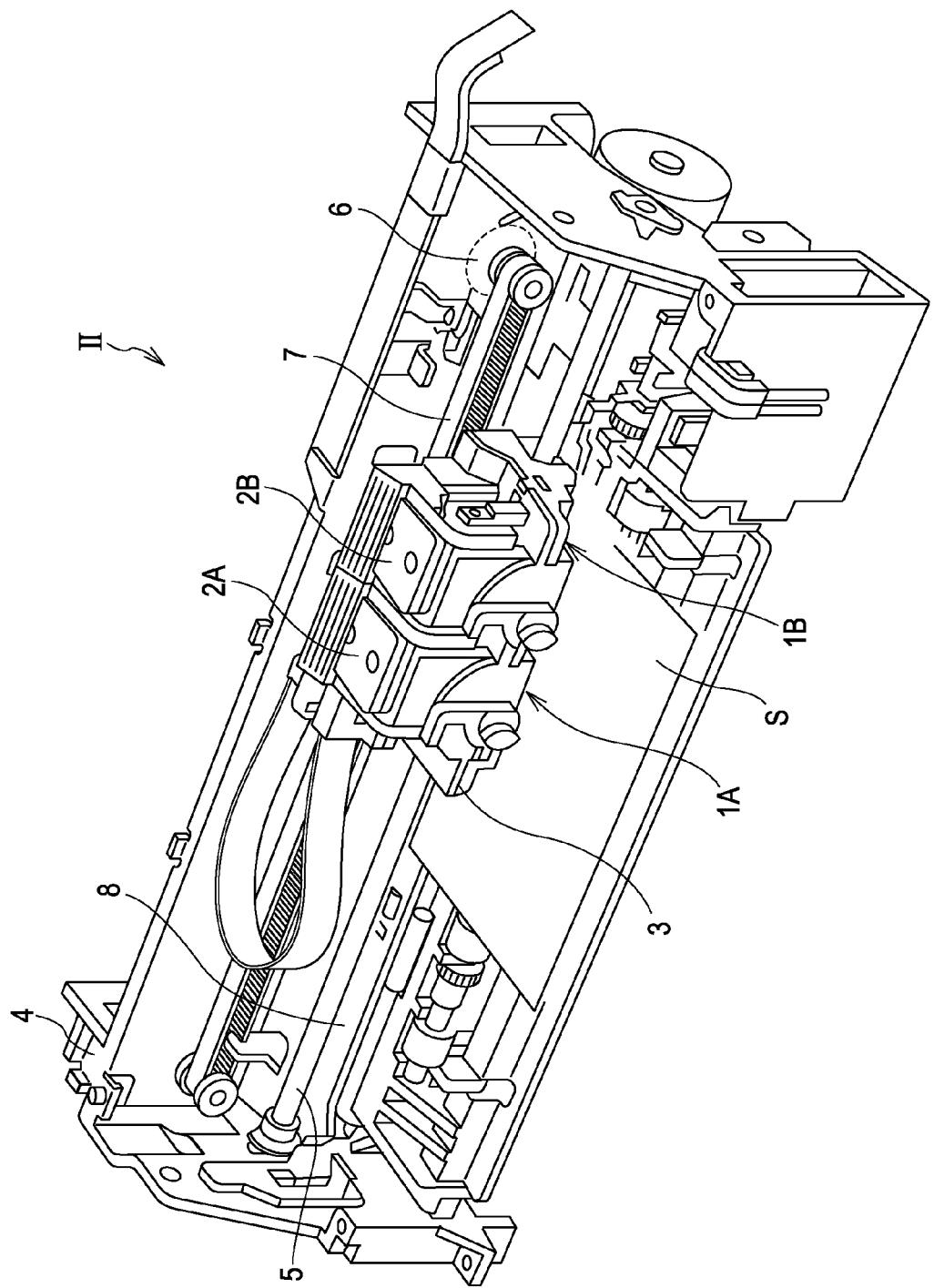
FIG. 12 is a schematic view of a recording apparatus according to an embodiment of the invention.

The ink jet recording head according to an embodiment of the invention can be installed in an ink jet recording apparatus to serve as a part of a recording head unit including ink flow channels communicating with an ink cartridge or the like. FIG. 12 is a schematic perspective view of such an ink jet recording apparatus.

The ink jet recording apparatus II shown in FIG. 12 includes recording head units 1A and 1B each including the ink jet recording head I, and cartridges 2A and 2B for supplying ink are removably mounted in the respective recoding head units 1A and 1B. The recording head units 1A and 1B are loaded on a carriage 3 secured for movement along a carriage shaft 5 of an apparatus body 4. The recording head units 1A and 1B discharge, for example, a black ink composition and a color ink composition, respectively.

The carriage 3 on which the recording head units 1A and 1B are mounted is moved along the carriage shaft 5 by transmitting a driving force from a driving motor 6 to the carriage 3 through a plurality of gears (not shown) and a timing belt 7. In the apparatus body 4, a platen 8 is disposed along the carriage shaft 5 so that a recording sheet S, which is a recording medium such as a paper sheet fed from, for example, a feed roller (not shown), is transported over the platen 8.

Although the above embodiment has described an ink jet recording head as the liquid ejecting head, the invention is intended for any type of liquid ejecting head, and may be applied to other liquid ejecting heads that eject liquid other than ink. Other liquid ejecting heads include various types of recording head used in image recording apparatuses such as printers, color material ejecting heads used for manufacturing color filters of liquid crystal displays or the like, electrode material ejecting heads used for forming electrodes of organic EL displays or field emission displays (FEDs), and bioorganic material ejecting heads used for manufacturing biochips.

The piezoelectric elements according to embodiments of the invention can be used in other equipment, for example, ultrasonic oscillators and other ultrasonic wave devices, ultrasonic motors, piezoelectric sensors that detect deformation of the piezoelectric layer as electrical signals, pressure sensors, and pyroelectric sensors such as IR sensors, without being limited to the use in liquid ejecting heads such as ink jet recording heads. Also, the piezoelectric element according to an embodiment of the invention may be applied to a ferroelectric element of a ferroelectric memory device.

What is claimed is:

1. A liquid ejecting head that discharges a liquid through a nozzle aperture, the liquid ejecting head comprising:
   a nozzle plate that includes the nozzle aperture;
   a piezoelectric element including a plurality of piezoelectric layers positioned on the nozzle plate, the piezoelectric layers each being made of a complex oxide containing bismuth, iron, barium and titanium and having a perovskite structure;
   a first electrode located between the piezoelectric layers and the nozzle plate; and
   a second electrode provided on the piezoelectric layers,
   wherein an iron content in a portion of the piezoelectric layers extends from the interface between the piezoelectric element and the second electrode to a depth of about 50 nm is higher than an iron content in the remaining portions of the portions of the piezoelectric layers.

2. A liquid ejecting apparatus comprising the liquid ejecting head as set forth in claim 1.

3. A piezoelectric device comprising:
   a piezoelectric element including an upper major surface and a lower major surface, the piezoelectric element including a plurality of piezoelectric layers each including a complex oxide containing bismuth, iron, barium and titanium and having a perovskite structure;
   a first electrode proximate the lower major surface; and
   a second electrode proximate the upper major surface,
   wherein an iron content in a portion of the piezoelectric layers that extends from an interface of the piezoelectric element and the second electrode to a depth of about 50 nm is higher than remaining portions of the piezoelectric layers.

* * * * *